United States Patent [19]

Faris

[11] 4,360,898
[45] Nov. 23, 1982

[54] PROGRAMMABLE LOGIC ARRAY SYSTEM INCORPORATING JOSEPHSON DEVICES

[75] Inventor: Sadeg M. Faris, Yorktown Heights, N.Y.

[73] Assignee: International Business Machines Corporation, Armonk, N.Y.

[21] Appl. No.: 164,118

[22] Filed: Jun. 30, 1980

[51] Int. Cl.³ .............................................. G11C 11/44
[52] U.S. Cl. .................................... 365/162; 365/160
[58] Field of Search ......................... 365/94, 162, 160

[56] References Cited

U.S. PATENT DOCUMENTS

| | | | |
|---|---|---|---|
| 3,758,795 | 11/1973 | Anaker | 365/162 |
| 3,849,276 | 11/1974 | Greiner | 365/162 |
| 3,913,120 | 10/1975 | Lahiri | 365/162 |
| 4,130,893 | 12/1978 | Henkels | 365/162 |
| 4,149,097 | 4/1979 | Faris | 365/162 |
| 4,151,605 | 4/1979 | Faris | 365/162 |
| 4,198,577 | 4/1980 | Faris | 365/162 |
| 4,210,921 | 7/1980 | Faris | 365/162 |

OTHER PUBLICATIONS

IBM Tech. Dis. Bul., vol. 17, No. 7, Dec. 1974, "Personalization Approach for Josephson Array Logic Memory Cells", Terlep, pp. 2059-2060.
IBM Tech. Dis. Bul., vol 20, No. 10, Mar. 1978, "Coupling Element for Josephson Read-Only Memory", Faris, pp. 4197-4198.
"Model for a 15 NS 16K RAM with Josephson Junctions", R. F. Broom, *IEEE Journal of Solid State Circuits*, vol. SC-14, No. 4, Aug. 1979, pp. 690-699.
"Basic Design of Josephson Technology Cache Memory", S. M. Faris et al., IBM Journal of R & D, vol. 24, No. 2, Mar. 1980, pp. 143-154.

*Primary Examiner*—Terrell W. Fears
*Attorney, Agent, or Firm*—Thomas J. Kilgannon, Jr.

[57] ABSTRACT

A Programmable Logic Array (PLA) system which utilizes Josephson devices and the noninverting capabilities of these devices is disclosed. The disclosed PLA system includes a personalized Read Only Memory (ROM) which is adapted to store the applied input signals as well as the output signals which are a logic function of the input signals. As soon as outputs from the ROM are available, an interface circuit which may be timed or untimed, inverting or noninverting provides output signals which can be utilized to drive other logic circuits or to act as inputs to another personalized Read Only Memory (ROM). The latter provides another logic function of the inputs at its outputs. Again, the outputs may be used directly or applied to another interface circuit which itself may provide inverted or noninverted outputs.

Like the first mentioned ROM, the second mentioned ROM is capable of storing its inputs and the resulting outputs which are some logic function of the inputs as a result of the ROM personalization. The ROM's involved utilize memory cells which are programmable Josephson junction devices operating in a liquid helium environment.

The programmable logic array system is disclosed in a full adder embodiment which is dc powered. A similar hybrid embodiment using both ac and dc power is also shown. The resulting system using high density ROM's provides high speed logic using relatively standard loop circuits which minimize the effect of the presence of resonances of known random logic circuits.

33 Claims, 5 Drawing Figures

| | INPUTS | | | | | | OUTPUTS | |
|---|---|---|---|---|---|---|---|---|
| $X_n$ | $\overline{X_n}$ | $Y_n$ | $\overline{Y_n}$ | $C_{n-1}$ | $\overline{C_{n-1}}$ | $S_n$ | $C_n$ | $\overline{C_n}$ |
| 1 | 0 | 1 | 0 | 1 | 0 | 1 | 1 | 0 |
| 1 | 0 | 1 | 0 | 0 | 1 | 0 | 1 | 0 |
| 1 | 0 | 0 | 1 | 1 | 0 | 0 | 1 | 0 |
| 1 | 0 | 0 | 1 | 0 | 1 | 1 | 0 | 1 |
| 0 | 1 | 1 | 0 | 1 | 0 | 0 | 1 | 0 |
| 0 | 1 | 1 | 0 | 0 | 1 | 1 | 0 | 1 |
| 0 | 1 | 0 | 1 | 1 | 0 | 0 | 0 | 1 |
| 0 | 1 | 0 | 1 | 0 | 1 | 1 | 0 | 1 |

PROGRAMMABLE LOGIC ARRAY SYSTEM INCORPORATING JOSEPHSON DEVICES

DESCRIPTION

1. Technical Field

This invention relates to programmable logic array systems and more particularly to such systems which utilize Josephson circuits and devices. The system takes advantage of the non-inverting capability of Josephson junction devices and operates in dc and a hybrid dc-ac modes. In certain implementations, the inputs to a ROM and the outputs can be stored as long as the liquid helium environment is preserved. In addition, any desired logical function can be implemented.

2. Background Art

Programmed logic arrays are already well known in the semiconductor arts and, in general, they take advantage of the inverting capability of transistor devices. To the extent that Josephson devices are noninverting, there is no known Josephson analog which takes advantage of the noninverting capability of Josephson junction devices.

An article entitled "Personalization Approach For Josephson Array Logic Memroy Cells" by K. D. Terlep in the IBM Technical Disclosure Bulletin, Vol. 17, No. 7, December 1974, page 2059 shows a programmable logic array system incorporating Josephson junction devices. This prior art system utilizes an AND array and an OR array connected by an interface circuit and is provided with an output register. Personalization of both of the prior art arrays appears to be achieved electronically while all inputs are inhibited. The output of the AND array requires sensing, inversion and redrive operations indicating that the outputs of the AND array were already inverted. To the extent that the interface circuit is untimed, it appears that there is no storage in the array of the input signals or the converted input signals which are the output of the array. Under such circumstances, once the input signals are applied, the output of the AND array ripples through the interface circuit; is converted by the personalization of the OR array and is delivered to an output register. Apart from any specific circuit differences, the arrays utilized do not appear to be comprised of Josephson Read Only Memories which have specific properties. As a result, the arrays and system of the article are constrained as to the types of interface circuits, timing, requirements for inversion circuits and the like. Finally, While the personalization is stored to apply some logic function to the input signals to the arrays, there appears to be no capability for storing either the input or output information utilized by the arrays.

Loops per se are well known in the superconducting arts as elements which store circulating currents. U.S. Pat. No. 4,198,577, Ser. No. 936,147 filed Aug. 23rd, 1978 entitled "Loop Decoder for Josephson Memory Arrays" and assigned to the same assignee as the present invention shows the use of loops in a decoder environment. The patent shows the diversion of current into a loop, the storage of circulating currents therein and the use of a resetting junction to eliminate the circulating currents. The use of loops, however, in a Read Only Memory environment wherein the input and output of the ROM are stored has not been shown elsewhere.

Accordingly, it is a principal object of the present invention to provide a Programmable Logic Array (PLA) system which utilizes the inherent noninverting capability of Josephson junction devices.

It is another object of the present invention to provide a PLA system which includes a Read Only Memory (ROM) which simultaneously provides a given logic function at its output and stores the given logic function.

Still another object of the present invention is to provide a PLA system which stores the input signals applied to a ROM portion thereof.

It is another object of the present invention to provide timed or nontimed, inverting or noninverting interface circuits which manipulate the outputs of the system ROM's.

BRIEF SUMMARY OF THE INVENTION

The Programmable Logic Array System of the present invention, in a preferred embodiment, utilizes a Read Only Memory (ROM) which has been programmed to provide a given logic function at its output. Simultaneously, both the input and the output of the ROM are stored until another input is applied. To the extent that control of the ROM output is desired, a timed interface circuit which may be inverting or noninverting is utilized. The output of the interface circuit may be provided on a timed or untimed basis to a second ROM which is similar to the first ROM except that it provides a logic function different from the logic function of the first ROM at its output. Both the input and output to the second ROM can be stored in the ROM until the next input is applied to it. An interface circuit like the first mentioned interface circuit can be utilized to provide inverted or noninverted, timed or untimed output signals depending on the needs of following circuitry.

The functions and circuits broadly described hereinabove are shown in detail in a full adder circuit which includes an AND ROM and an OR ROM interconnected by means of a noninverting, timed interface circuit. The output of the OR ROM is applied to an interface circuit which is responsive to only one transition of an input which normally has a pair of oppositely going current transitions. By the judicious selection of gate current direction and circuit parameters, this circuit can be made to act as an inverter so that an output signal is provided when a signal is, in effect, removed from its input.

The noninverting, timed interface circuit mentioned above reproduces the output of the AND ROM upon the timed application of gate current to the circuit and simultaneously transmits this information as inputs to the OR ROM. Both ROM's utilize orthogonally related gate and control currents to switch selected Josephson junction memory cells in these arrays. Both the gate currents and control currents are provided by superconducting loop circuits which are in turn controlled by switchable devices which switch the same dc current into the orthogonally disposed gate and control line loops. A plurality of Josephson devices which can switch or not switch in accordance with a built-in, fixed program are disposed in series in each of a plurality of loops which carry gate current. A plurality of loops which carry control line current each control one device in each of the gate current loops. Thus, when gate and control currents are present in the same memory cell, it will switch or not switch depending on whether it has been preprogrammed to do so or not. To the extent that Josephson devices are inherently latching in character, the use of loop circuits totally avoids this latching characteristic and allows use of dc power for the whole system. To the extent that ac powering of such an arrangement is desired in some cases, latched Josephson devices (unless made self-resetting by other means) are returned to their zero voltage state each time the applied ac reverses polarity. The regulation requirements of ac powered circuits impose both power and area penalities but, where required, full ac or hybrid ac-dc approaches can be embodied. The hybrid approach can retain the advantages obtained where loop circuits are utilized to provide control currents to devices the gate currents of which are provided from ac sources. These and other objects, features and advantages will be more apparent from the following more particular discription of the preferred embodiments.

DETAILED DESCRIPTION OF THE PREFERRED EMBODIMENTS

Figure 1:
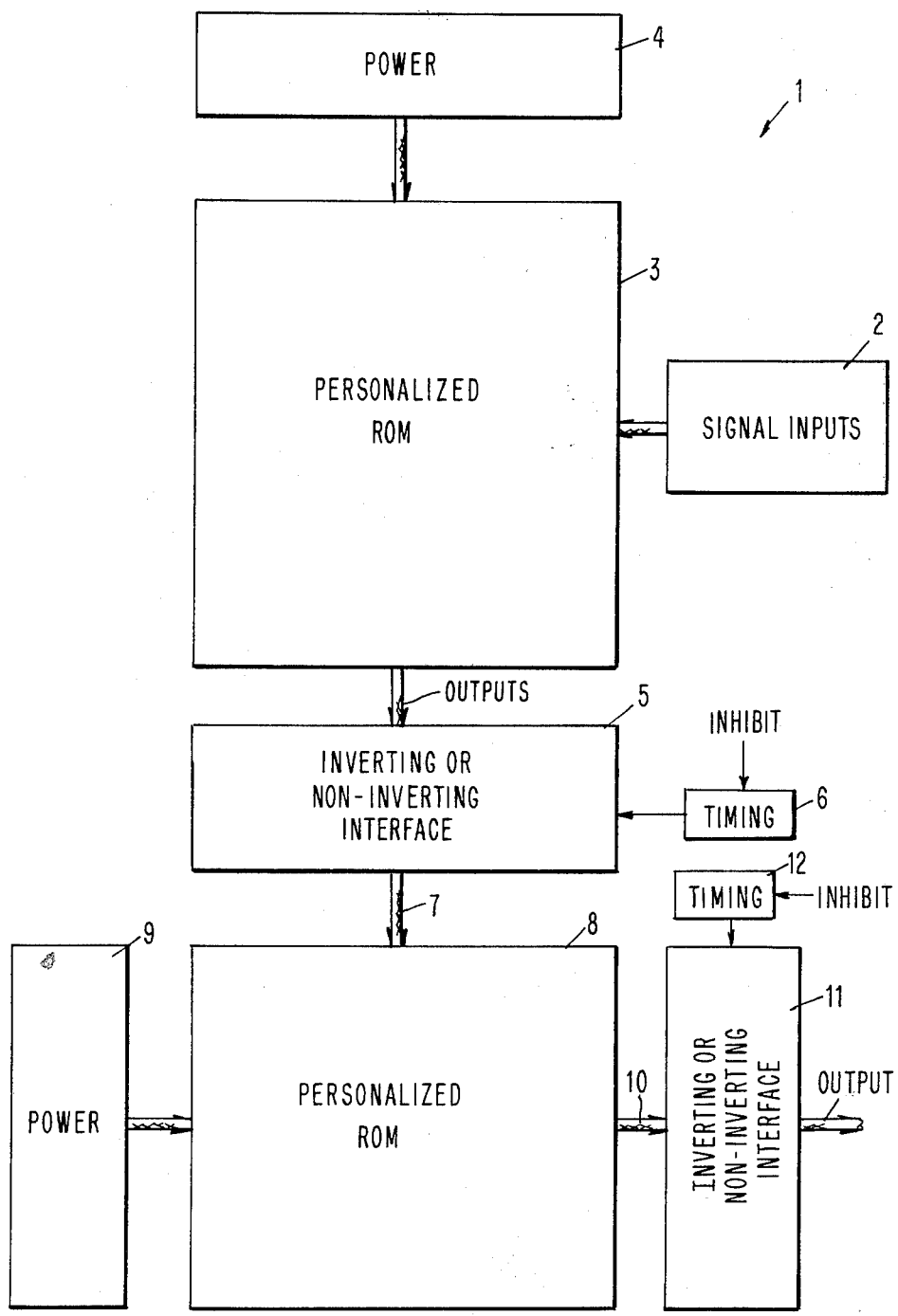
FIG. 1 is a block diagram of a Programmable Logic Array System which utilizes the noninverting capabilities of Josephson junctions. The system includes personalized ROM's which are interconnected by a timed or untimed, inverting or noninverting interface circuit. The ROM's are personalized to carry out a desired logic function on digital input signals which may include a plurality of digital true and complement signals. The resulting outputs represent the inputs which have been modified in accordance with the personalization of the system ROM's.

Referring now to FIG. 1, there is shown therein a block diagram of a programmable logic array system which utilizes the noninverting capabilities of Josephson junctions. The system includes personalized ROM's which are interconnected by a timed or untimed, inverting or noninverting interface circuit. The ROM's are personalized to apply a given logic function to digital input signals. The digital input signals can include a plurality of digital true and complement signals and are applied from pulsed current sources. The outputs from each of the ROM's represent the inputs which have been modified in accordance with the specific personalization of each of the ROM's.

Referring now to FIG. 1 in more detail, there is shown a Programmable Logic Array System (PLA) 1 which includes a source of signal inputs 2 which apply digital signals to a personalized ROM 3. In the broadest sense, personalized ROM 3 may be any Read Only Memory which is capable of simultaneously converting the digital input signals to output signals representative of a given logic function and storing the resulting output signals. In addition to input from signal inputs 2, PLA system 1 includes a source of power 4 which is applied to the memory cells of personalized ROM 3. As will be seen hereinafter in more detail, personalized ROM 3 may consist of an array of Josephson junction memory cells which have been personalized in a preprogrammed manner to switch or not switch depending on what logic function the output of ROM 3 is to represent. In the Josephson junction environment, the output of block 4 is a plurality of currents each of which energizes a column of memory cells in ROM 3. In the same environment, the digital signals from block 2 are applied to ROM 3 and to rows of memory cells disposed therein via control lines which are disposed in electromagnetically coupled relationship with the Josephson junction memory cells. The presence of gate current from block 4 and an orthogonally applied digital signal from block 2 at any memory cell causes that memory cell to switch or not switch depending on whether or not it has been personalized in a manner to be shown hereinafter more specifically. ROM 3 and all the other circuits of FIG. 1 operate at the temperature of liquid helium and thereby achieve the benefits associated with the Josephson tunnelling phenomenon.

In FIG. 1, block 5 which is otherwise characterized in FIG. 1 as an Inverting or Noninverting Interface is coupled to ROM 3 via an interconnection labeled Outputs. To the extent that the outputs of ROM 3 represent a given logic function, these outputs can be utilized to drive other circuits represented by block 5 which either invert the outputs or leave them uninverted. To the extent that the outputs applied to block 5 remain stored in ROM 3, transmission of these output signals can be achieved on a timed or untimed basis by utilizing a timing circuit indicated by block 6 in FIG. 1 and otherwise characterized therein by the legend Timing. An input to block 6 labelled Inhibit in FIG. 1 inhibits timing signals from block 6 and enables the interface circuit of block 5 in such a way that the outputs of ROM 3 immediately appear at the output interconnection 7 of block 5. When timing from block 6 is utilized, the outputs of ROM 3 only appear at output interconnection 7 upon the application of a timing signal from block 6.

In the noninverting mode, block 5 may consist of a circuit arrangement which provides for only amplification. In the inverting mode, block 5 may be a circuit which, as will be shown in more detail hereinafter, responds only to the negative going transition of a pulse. There are many situations in digital logic circuits where inverted signals are required.

In addition to Inverting or Noninverting Interface 5, the outputs from ROM 3 which appear as inverted or noninverted outputs on output interconnection 7 may be applied as inputs to block 8 which is otherwise identified in FIG. 1 as Personalized ROM. The Personalized ROM of block 8 is identical in every way with Personalized ROM 3 except that it is personalized to apply a different logic function to the input signals applied from output interconnection 7. The signals applied from output interconnection 7 are applied to control lines which are connected to rows of Josephson junction memory cells. Gate current for these memory cells is obtained from block 9 which is otherwise identified in FIG. 1 by the legend Power. The outputs from personalized ROM 8 are the input signals applied to ROM 8 which have been converted to signals representative of a logic function which is different from the given logic function.

Like ROM 3, the input and outputs of ROM 8 are stored therein as long as new inputs are not applied and ROM 8 is maintained at the temperature of liquid helium.

The outputs of Personalized ROM 8 are applied via interconnection 10 to block 11 which is otherwise identified in FIG. 1 by the legend Inverting or Noninverting Interface. Block 11 in its inverting and noninverting modes may be embodied utilizing circuits which are identical with the circuits of block 5 in its inverting or noninverting modes. To the extent that the outputs of block 11 require timing, block 12 otherwise identified in FIG. 1 by the legend Timing may be utilized to provide such timing. Where no timing is required, block 12 may be inhibited as indicated by the legend Inhibit applied to block 12 so that outputs at interconnection 10 pass through interface 11 immediately. As with interface 5, the inverted outputs may also be timed or untimed.

In FIG. 1, the gate currents provided by blocks 4, 9 may be sources of dc current which supply both of ROM's 3, 8, both the interface circuits of blocks 5, 11, and both of the timing circuits of blocks 6, 12. With respect to the ROM's of blocks 3, 8, dc power is supplied as gate current to each of the memory cells of the ROM's. In an alternative arrangement, ac power may be utilized to supply the gate currents of the ROM's of blocks 3, 8 and the gate currents of interface circuits of blocks 5, 11.

As will be seen from the following more specific description of circuits for each of the blocks of FIG. 1, many of the circuits are already known, and indeed have been separately patented. However, the personalized ROM's of blocks 3, 8 have not heretofore been disclosed even though each of the ROM's incorporates prior art memory cells and the characteristics of known superconducting loops.

Figure 2:
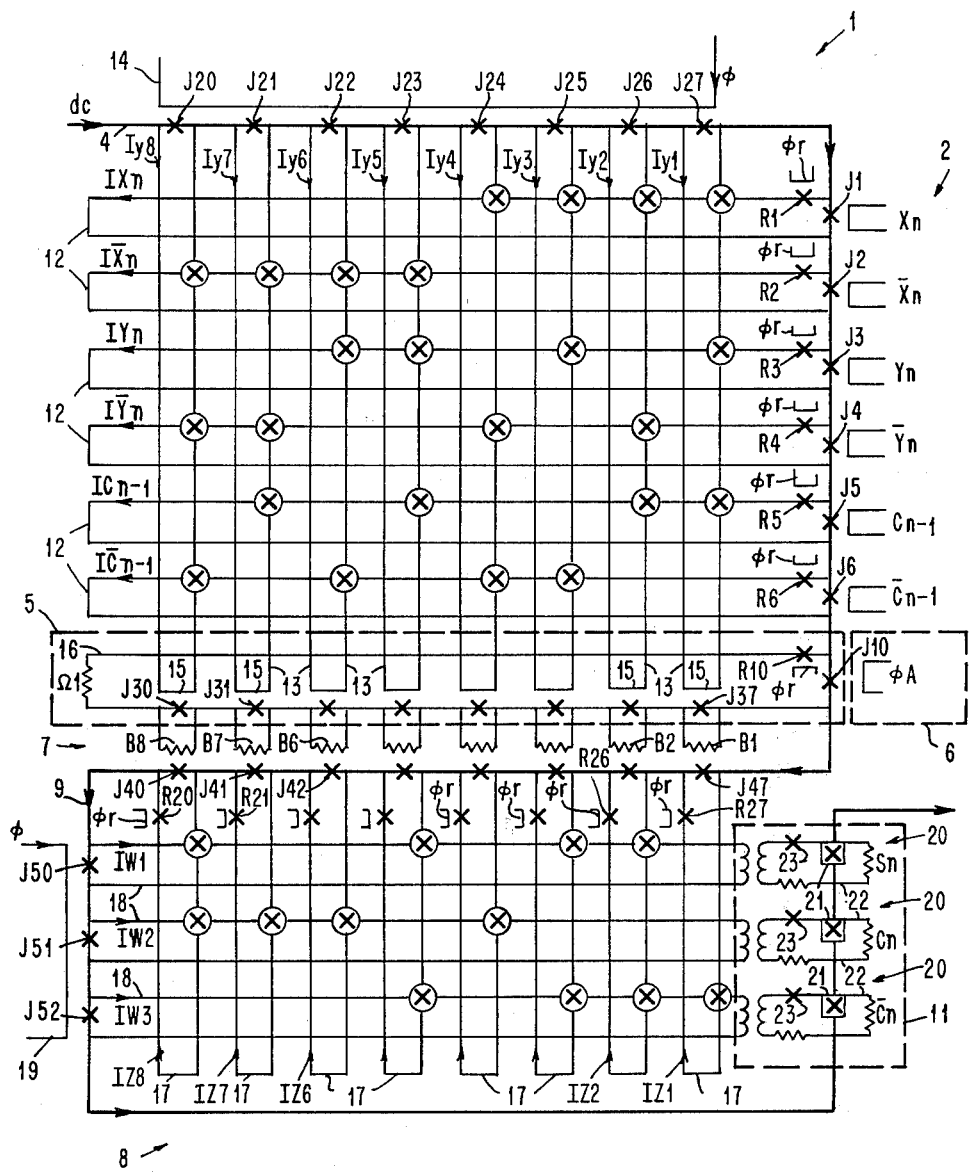
FIG. 2 is a schematic diagram of a full adder circuit which incorporates all the elements shown in the block diagram of FIG. 1.

Referring now to FIG. 2, there is shown therein a schematic diagram of a full adder circuit which incorporates the elements shown in the block diagram of FIG. 1. To the extent that the blocks of FIG. 1 are shown in detail in FIG. 2, the detailed circuits have been identified by the same reference characters.

In FIG. 2, Programmable Logic Array System 1 includes a personalized ROM 3 which converts signal inputs 2 to a given even logic function at the outputs of ROM 3. In FIG. 2, ROM 3 is formed from a plurality of horizontally arranged superconducting loops 12 and a plurality of vertically arranged superconducting loops 13 which are disposed orthogonally with respect to loops 12. Loops 12 are shunted by associated Josephson junction devices identified in FIG. 2 as devices J1-J6. Loops 13 are similarly shunted by associated Josephson junction devices J20-J27. Josephson junction devices J1-J6 are disposed in series with Josephson junction devices J20-J27 and with a source of dc current which is further identified in FIG. 2 by the numeral 4. Each of horizontal loops 12 has an associated Josephson junction device R1-R6 disposed in series in each loop 12. Each of devices R1-R6 is normally in its zero voltage stage but can be caused to switch in a well known way by the application of a control signal $\phi r$ to an associated control line.

The reference characters $\phi r$ identify both the control line and the control current applied to each control line in FIG. 2. As will be seen hereinafter, $\phi r$ is a reset signal. In FIG. 2 each of loops 12, 13 includes a current path and a return current path. The current path of each of loops 13 contains a plurality of Josephson junction memory cells which can be preprogrammed during fabrication of ROM 3 to switch or not switch in the presence of both gate and control currents. While any Josephson junction Read-Only Memory cell may be utilized in the practice of the present invention, one memory cell which may be utilized is that shown in IBM Technical Disclosure Bulletin, Vol. 20, No. 10, March 1978, page 4197 in an article entitled "Coupling Element for Josephson Read-Only Memory" by S. M. Faris. In the article, the memory cell is made up of a two junction interferometer wherein the junctions are defined by two insulating layers which are interposed between superconducting metal layers. The existence of the two insulating layers, in addition to the tunnel barrier, defines a logical "1" and the absence of one of the insulating layers defines a logical "0". Memory cells which have only one insulating layer in addition to the tunnel oxide have large area junctions which do not switch in the presence of gate and control current because they have very high threshold currents. Cells which have two insulating layers present in addition to the tunnel barrier, switch to the voltage state in the presence of gate and control currents. The memory cells of the article can be preprogrammed to switch or not switch during fabrication by having two or one insulating layers, respectively, formed during manufacture of the Read-Only Memory. In FIG. 2, gate currents $Iy1-Iy8$ are applied to a plurality of Josephson junction Read-Only Memory devices of the above mentioned article arranged in series in the current path of each loop 13. Memory cells which have been preprogrammed to switch to the voltage state are shown in FIG. 2 by the symbol $\otimes$. Control currents $IXn$, $I\overline{X}n$, etc., are applied to each memory cell via the current path of loops 12 which extend over a row of memory cells. While not specifically shown, it should be appreciated that a memory cell is disposed at each intersection of each of the current paths of loops 12, 13.

In FIG. 2, loops 12 shunt Josephson devices J1-J6. The switching of each of these devices is controlled by an associated control line identified in FIG. 2 by the legends $Xn$, $\overline{X}n$, $Yn$, $\overline{Y}n$, $Cn-1$, $\overline{C}n-1$. Each of these control lines is fed from pulsed current sources (not shown) and the legend associated with each control line indicates that a true or complement of a signal is being applied to a Josephson junction device associated with a particular control line.

In a similar way, Josephson junction devices J20-J27 are shunted by loops 13. These devices are, however, switched to their voltage state by a signal, $\phi$, which is applied to control line 14 which is disposed in electromagnetically coupled relationship with each of devices J20-J27.

Depending on the personalization and the inputs applied to ROM 3, current flows or does not flow in loops 13 and these currents represent the output of ROM 3. As shown in FIG. 2, portions 15 of loops 13 act as control lines for circuitry of interface 5. Interface 5 includes a Josephson junction J10 which is disposed in series with Josephson devices J1-J6 and is shunted by a loop 16 which is adapted to carry gate current to a plurality of Josephson junction devices J30-J37 which are disposed in series in loop 16. The switching of device J10 is timed from block 6. Block 6 in FIG. 2 shows a control line which is identified by the legend $\phi A$. This legend also identifies the pulsed signal applied to control line $\phi A$. Loop 16 has an additional Josephson junction device R10 disposed in series in loop 16 and controlled by a control line identified by the legend $\phi r$.

This legend also identifies the reset signal applied to device R10. To the extent that any of the devices J30–J37 switch, outputs B1–B8 may appear on interconnections 7.

In FIG. 2 interconnections 7 act as inputs to personalized ROM 8. Interconnections 7 are disposed in electromagnetically coupled relationship with associated Josephson junction devices J40–J47. These last mentioned devices are ultimately disposed in series with gate current dc source 4. Each of devices J40–J47 is shunted by a loop 17 which acts as a control line for a plurality of Josephson junction Read-Only Memory cells identical with those described in conjunction with ROM 3 hereinabove.

Loops 17 are superconducting loops which either carry currents IZ1–IZ8 or do not carry such currents depending on whether or not devices J40–J47 are switched and on the personalization of the Read-Only Memory cells of ROM 8.

In FIG. 2, arrow 9 indicates dc current which is a continuation of dc current 4 which ultimately provides gate current for all the Read-Only Memory cells. A plurality of Josephson junction devices J50–J52 are disposed in series with the dc current represented by arrow 9. Each of devices J50–J52 is shunted by a superconducting loop 18. Each loop 18 has a plurality of Read-Only Memory cells disposed in series therein and each loop 18 carries gate current when devices J50–J52 are switched in unison by the application of a pulsed current $\phi$ to control line 19 which is disposed in electromagnetically coupled relationship with these devices.

In FIG. 2, Josephson junction devices R20–R27 are each disposed in a respective loop 17 and are actuated from an associated control line designated in FIG. 2 by the legend $\phi r$. Both the control line and the applied pulsed reset signal are designated by the legend $\phi r$. Loops 18 are transformer coupled to an interface 11 which provides the output $S_n$, $C_n$ and $\overline{C}_n$. In the adder environment of FIG. 2, these outputs represent the sum, carry and complement of the carry. Interface circuit 11 includes three inverting circuits 20 each of which are designed to respond to a falling transition of a current pulse which has a rising and falling transition. Circuits 20 are identical with those described in U.S. Pat. No. 4,149,097 filed Dec. 30th, 1977 in the name S. M. Faris entitled "Wayform Transition Sensitive Josephson Junction Circuit Having Sense Bus and Logic Application" and assigned to the same assignee as the present invention. Each circuit 20 includes a device 21 capable of carrying Josephson current which is shunted by a utilization circuit 22. Current flowing in device 21 which is the same dc current as that indicated by arrow 9 in FIG. 2, is diverted to utilization circuit 22 in response to only one of a pair of transitions of a pulsed input applied to device 21. The pulsed input is that obtained from loop 18 which is transformer coupled to inverter circuit 20. On one transition of the applied pulsed input current, a current is induced in a current path which follows the input until the threshold of a switchable device 23 disposed in series in the current path is exceeded. Device 23 switches and the induced current drops to zero. If the current generated by the transition is in the opposite direction to current in Josephson junction device 21, device 21 remains in its unswitched state. However, when the other transition of the pulsed input occurs, the induced current follows the input and appears as a current in the same direction as the direction of the gate current flow in device 21 causing it to switch and deliver current to utilization circuit 22. The switching of device 23 when its threshold is exceeded again reduces the induced current to zero while simultaneously isolating the transformer input from utilization circuit 22.

In operation, the adder circuit of FIG. 2 first has gate current applied to ROM's 3, 8 by applying a current pulse $\phi$ simultaneously to control lines 14, 19. These control currents together with the dc current from dc sources 4, 9 flowing in devices J20–J27 and devices J50–J52, respectively, cause all these devices to switch from their normal zero voltage state to their voltage state causing currents Iy1–Iy8 to flow in respective loops 13 and currents IW1–IW3 to flow in their respective loops 18. Once these currents have been established, all the memory cells of ROM's 3, 8 are enabled and only require the application of control currents IXn, I$\overline{X}$n–ICn-1, I$\overline{C}$n-1 and IZ1–IZ8. The control currents for ROM 3 are provided by the actuation of signal inputs 2 which provides a plurality of true and complement signals as shown in FIG. 2. Thus, signals Xn or $\overline{X}$n, Yn or $\overline{Y}$n and Cn-1 or $\overline{C}$n-1 are provided. Assuming that the inputs Xn, Yn, Cn-1 and their complements are applied at input signals 2, devices J1, J3 and J5 switch to their voltage state diverting dc current 4 into associated loops 12 which act as control lines for a row Josephson junction Read-Only Memory cells. In the loop in which current IXn flows, the Read-Only Memory cells carrying currents Iy1–Iy4 switch to their voltage state and the just mentioned currents are reduced to zero in their respective superconducting loops 13. The switching of device J3 to its voltage state applies control current IYn to an associated row of Read-Only Memory cells causing those cells which carry current Iy1, Iy3, Iy5 and Iy6 to switch to their voltage state. Similarly, the switching of device J5 provides current ICn-1 in its associated loop 12 and causes the memory cells having currents Iy1 Iy2, Iy5 and Iy7 to switch to their voltage state. Based on the applied inputs, current flow is dropped to zero in all loops 13 except the loop 13 which shunts device J20. Thus, current Iy8 flows in control line portion 15 of superconducting loop 13 which shunts device J20. In the meantime, signal $\phi$ on control line 14 has disappeared and devices J20–J27 have reset to their zero voltage state leaving only circulating current Iy8 flowing in the loop shunting device J20. This current is a circulating current which is undisturbed by the fact that its associated device J20 has reset itself to its zero voltage state as soon as dc current 4 was diverted from it. Similarly, devices J50–J52 of ROM 8 reset to their zero voltage states as soon as they switch and divert currents IY1–IW3 into their associated loops 18.

As soon as the current transfer into loops 12 is completed, a timing pulse $\phi A$ is applied to control line $\phi A$ from block 6 causing an associated Josephson junction device J10 to switch to its voltage state and causing dc current 4 to flow in its associated loop 16 thereby providing a gate current to Josephson junction devices J30–J37. Because current flow is present only in control line portion 15 which is disposed in electromagnetically coupled relationship with device J30, this is the only device which switches to its voltage state delivering a replica of current in control line 15 to an output identified as output B8 in FIG. 2. Output B8 which is provided in a load circuit which includes a resistor and a control line portion (not shown) causes Josephson junction device J40 to switch to its voltage state diverting current IZ8 into its associated loop 17 which acts as a control line for a plurality of Read-Only Memory cells. Because gate currents IW1–IW3 are already flowing in their associated loops 18, the switching of preprogrammed Read-Only Memory cells which carry currents IW1, IW2 causes currents IW1, IW2 to drop to zero while current IW3 remains flowing in its associated loop 18. To the extent that only current IW3 remains flowing in its associated loop 18, the only current transition lowermost inverter circuit 20 encounters is when current IW3 is initially diverted into its loop 18 upon switching of device J52. Under these circumstances, device 21 of the lowermost inverter circuits 20 does not switch and no output is delivered to its associated load circuit 22. Accordingly $\bar{C}n$ is a binary 0. The other two inverter circuits 20 also encounter a waveform transition upon the switching of devices J50,J51. Devices 21 of these inverter circuits 20 also do not switch because the current induced is opposite in direction to dc current 9 flowing in these devices. However, when device J40 switches, current IZ8 flowing in loop 20 17 causes the two switchable Read-Only Memory cells (designated by the symbol ⊗) associated with loop 17 to switch to their voltage state dropping currents IW1 and IW2 to zero. The resulting current transition causes current to flow in the same direction as the gate current 9 flowing in devices 21 and devices 21 switch delivering current to their loads. This causes the outputs Sn,Cn to be binary 1's. The resulting outputs of interface 11 are shown under Outputs in the adder truth table of FIG. 3. Other possible inputs and outputs are shown in the truth table of FIG. 3.

When the desired outputs have been achieved, a pulse $\phi r$ is applied to the control lines of reset Josephson junctions R1–R6, to reset Josephson device R10 in interface 5 and to reset Josephson devices R20–R27. The switching of these devices eliminates circulating currents in loops 12, 17, which, if they remained, might cause spurious operation of ROM's 3, 8. To the extent that circulating currents remain in loops 13, 18, they do not impact the operation of the system because gate current is always diverted into them at the beginning of the next cycle. The resistance $\Omega 1$ terminating loop 16 in FIG. 2 has a resistance value which causes that loop to operate in a nonlatching mode. The resistances associated with outputs B1–B8 in FIG. 2 have values which are sufficient to render the associated devices J30–J37 self-resetting. From the foregoing, it should be clear that the input information and output information of ROM 3 is stored in loops 12, 13, respectively, until loops 12 are reset. The input and output information of ROM 8 is also stored until loops 17 are reset. Also, from the foregoing, it should be clear that the timing action of timing block 6 may not be inhibited in the instance of FIG. 2 because an output would appear at each of the outputs B1–B8 as soon as current was applied to control lines 14, 19. Depending on the desired logic function, it should now be obvious that interfaces 5 and 11 may be utilized to provide noninverted or inverted outputs as well as outputs which are timed or untimed. While ROM's 3, 8 have not been specifically characterized previously, it should be clear that ROM 3 performs the AND (product) operation whereas ROM 8 performs an OR (sum) operation.

Figure 4:
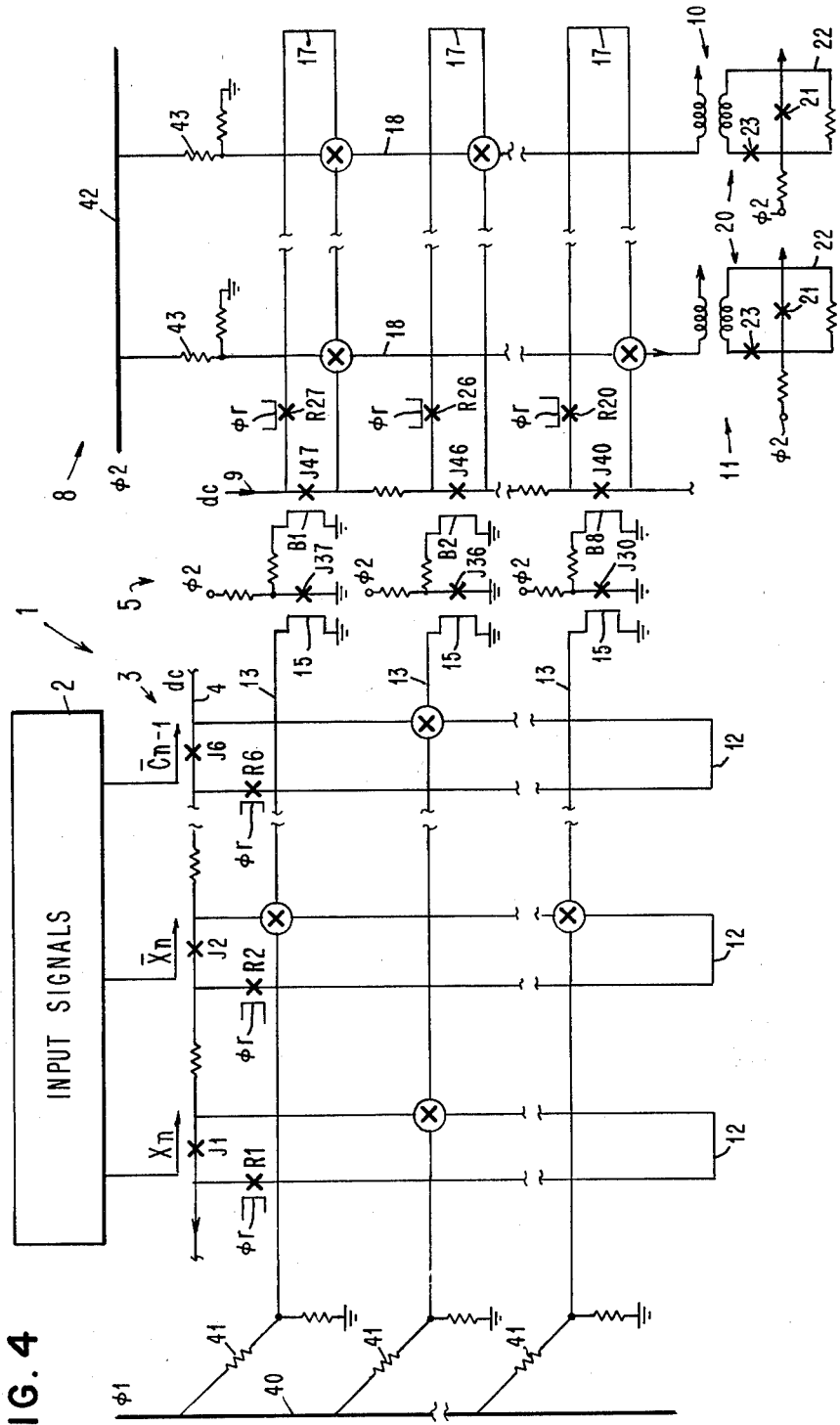
FIG. 4 is a schematic diagram showing an AND ROM, an OR ROM and interface circuits wherein the ROM's are both dc and ac powered. In this arrangement, the gate currents to the memory cells of both ROM's and the power to the interface circuits are provided from pulsed dc or ac sources while the control currents of the memory cells are provided from dc sources.

Referring now to FIG. 4, there is shown a schematic diagram of an AND ROM, OR ROM and interface circuits wherein the ROM's are both dc and ac powered. In the circuit arrangement shown, the gate currents to the memory cells of both ROM's and the power to the interface circuits are provided from ac sources while the control currents of the memory cells are provided from dc sources. FIG. 4 shows only a portion of the circuitry of FIG. 2 and the elements which are identical have the same reference characters in FIG. 4 as they have in FIG. 2.

FIG. 4 differs from FIG. 2 in that devices J20–J27 and devices J50–J52 have been eliminated and pulsed dc or ac sources have been substituted to supply gate currents to ROM's 3, 8. In addition, timing block 6 and device J10 have been eliminated and a pulsed dc or ac source is utilized to power interface circuit 5. In FIG. 4, a bus 40 carrying either pulsed dc or a trapezoidally shaped ac current is connected to loops 13 via current limiting resistors 41. These currents are otherwise identified in FIG. 4 by the legend $\phi 1$ to indicate that these currents are applied first. Another pulsed dc or trapezoidally shaped ac current is applied from bus 42 via current limiting resistors 43 to loops 18. These currents are otherwise identified in FIG. 4 by the legend $\phi 2$ to indicate that they are applied after the application of currents $\phi 1$. The current $\phi 2$ also actuates interface circuit 5 which provides outputs B1–B8 depending on the inputs to and personalization of ROM 3. Similarly, inverter circuits 20 of interface 11 are each supplied with currents $\phi 2$. In the pulsed dc mode, $\phi 1$ is applied causing gate current to flow in the Read-Only Memory cells disposed in series in each of loops 13. When the input signals are applied, depending on the personalization of ROM 3, currents in certain loops 13 are suppressed while currents remain in others of loops 13. Before pulsed dc $\phi 1$ goes down, pulsed dc $\phi 2$ comes up providing gate currents to devices J30–J37 of interface 5 and the memory cells associated with loops 18 of ROM 8. An output on any of the outputs B1–B8 energizes an associated device J40–J47 causing control current to flow in loops 17 and causing current to drop to zero in loops 18 depending on the personalization of the memory cells of ROM 8. This change in current is transformer coupled to inverter circuits 20 which are also powered by pulsed dc $\phi 2$ providing an inverted output at their load circuits 22. When currents $\phi 1$, $\phi 2$ go to zero all devices receiving these currents return to their zero voltage state. After applying a reset signal $\phi r$, loops 12, 17 are ready to receive input information.

In an ac mode of operation, system 1 operates in the same manner as described in connection with the application of pulsed dc. The trapezoidally shaped ac current wave $\phi 1$ is always applied before the trapezoidally shaped current wave $\phi 2$. In the ac mode, each time the current wave passes through zero, the Josephson junction devices supplied with ac current all reset to their zero voltage state. Like the dc mode, loops 12, 17 must be reset by the application of a signal $\phi r$ to eliminate circulating currents flowing therein.

Figures 3, 5:
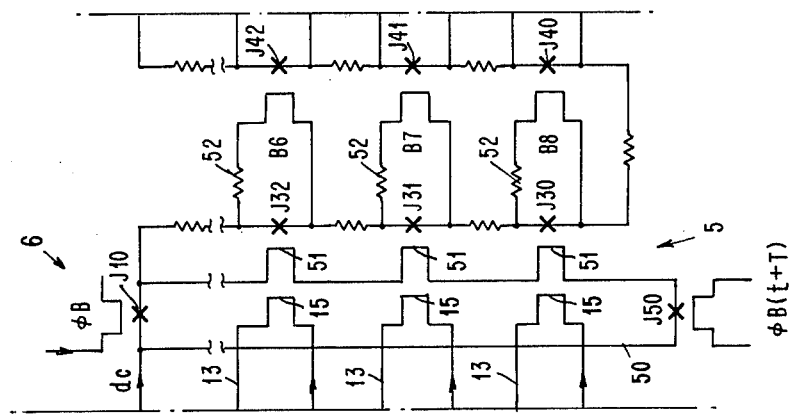
FIG. 3 is a truth table for the full adder circuit of FIG. 2.
FIG. 5 is a schematic diagram of an interface circuit which is totally dc powered and employs self-resetting loops in the interface.

Referring now to FIG. 5, there is shown an interface circuit 5 which is totally dc powered and employs self-resetting loops in the interface. In this arrangement, devices J30–J37 are actuated only by the combination of dc current in a loop 50 and a current in one or more control line portions 15 of loops 13. Thus, the application of a pulse $\phi B$ switches Josephson junction device J10 to the voltage state causing dc current to flow in control line portions 51. The coincidence of currents in a control line portion 15 and a control line portion 51 switches an associated Josephson junction device J30–J37 diverting dc current to provide one or more output B1–B8.

When Josephson junction device J50 is actuated, dc current is eliminated from loop 50 and Josephson junction devices J30–J37 reset to their zero voltage state if they have been switched to their voltage state. Resistances 52 are an appropriate value to permit self-resetting of devices J30–J37. Device J50 is switched at a time T after the switching of device J10.

Typical Josephson junctions and interconnections circuitry which may be utilized in the practice of the present invention are shown in U.S. Pat. No. 3,758,795, Ser. No. 267,841 filed June 30, 1972 and assigned to the same assignee as the present invention.

A typical fabrication technique for forming Josephson junction devices is shown in U.S. Pat. No. 3,849,276, Ser. No. 125,993 filed Mar. 19, 1971. Load impedances and resistors which must not be superconductive at the operating temperature of PLA system 1 may be fabricated with compatible materials which display resistance at the desired operating temperature. U.S. Pat. No. 3,913,120, Ser. No. 429,461 filed Dec. 28, 1973 and assigned to the same assignee as the present invention shows a material and method of fabrication for circuitry and a terminating resistor which may be utilized in the practice of the present invention.

Industrial Applicability

The system of the present invention has application in the logic and memory arrays of Josephson data processing digital computers. They are particularly applicable to carrying out logic functions which, in turn, can be embodied with very high densities.

Having thus described my invention, what I claim as new, and desire to secure by Letters Patent is:

1. A programmable logic array system comprising: means for generating a plurality of input signals, and, superconducting read-only memory means connected to said generating means for converting said input signals to output signals different from said input signals for simultaneously storing said input and output signals in said read-only memory means in the absence of further input signals.

2. A programmable logic array system according to claim 1 further including means responsive to said output signals connected to said means for simultaneously converting and storing.

3. A programmable logic array system according to claim 1 wherein said means for generating includes a plurality of pulsed current sources.

4. A programmable logic array system according to claim 1 wherein said means for converting said input signals and simultaneously storing said input and output signals includes
a memory array which includes a plurality of personalized Josephson junction memory cells the output of which is a stored logic function of said input signals.

5. A programmable logic array system according to claim 1 wherein said means for converting and simultaneously storing said input and output signals includes a plurality of superconducting storage loops.

6. A programmable logic array system according to claim 2 wherein said means for generating includes a plurality of pulsed current sources.

7. A programmable logic array system according to claim 2 wherein said means for converting said input signals and simultaneously storing said input and output signals includes
a memory array which includes a plurality of personalized Josephson junction memory cells the output of which is a stored logic function of said input signals.

8. A programmable logic array system according to claim 2 wherein said means responsive to said output signals includes
means for providing noninverted output signals connected to said means for converting said input signals and for simultaneously storing said input and output signals.

9. A programmable logic array system according to claim 2 wherein said means responsive to said output signals includes
means for providing inverted output signals connected to said means for converting said input signals and for simultaneously storing said input and output signals.

10. A programmable logic array system according to claim 4 wherein said plurality of pulsed current sources generate pulses which are the true and complement of said input signals.

11. A programmable logic array system according to claim 4 wherein said means for generating includes a plurality of pulsed current sources.

12. A programmable logic array system according to claim 5 further including means responsive to said output signals connected to said means for converting and simultaneously storing.

13. A programmable logic array system according to claim 7 wherein said means responsive to said output signals includes
means for providing noninverted output signals connected to said means for converting said input signals and for simultaneously storing said input and output signals.

14. A programmable logic system according to claim 7 wherein said means responsive to said output signals includes
means for providing inverted output signals connected to said means for converting said input signals and for simultaneously storing said input and output signals.

15. A programmable logic array system according to claim 8 wherein said means responsive to said output signals further includes
means connected to said means for providing for converting said noninverted output signals to other output signals and for simultaneously storing said noninverted output signals and said other output signals.

16. A programmable logic array system according to claim 9 wherein said means responsive to said output signal further includes
means connected to said means for providing for converting said inverted output signals to other output signals and for simultaneously storing said inverted output signals and said other output signals.

17. A programmable logic array system according to claim 10 wherein said means for converting said input signals and simultaneously storing said input and said output signals includes
a memory array which includes a plurality of personalized Josephson junction memory cells the output of which is a stored logic function of said input signals.

18. A programmable logic array system according to claim 15 further including means responsive to said output signals connected to said means for converting and simultaneously storing.

19. A programmable logic array system according to claim 12 wherein said means responsive to said output signals includes
means for providing noninverted output signals connected to said means for converting said input signals and for simultaneously storing said input and output signals,
means connected to said means for providing for converting said noninverted output signals to other output signals and for simultaneously storing said noninverted output signals and said other output signals, and,
means responsive to said other output signals connected to said last mentioned means for converting and simultaneously storing.

20. A programmable logic array system according to claim 12 wherein said means responsive to said output signals includes
means for providing inverted output signals connected to said means for converting said input signals and simultaneously storing said input and output signals,
means connected to said means for providing for converting said inverted output signals to other output signals and for simultaneously storing said inverted output signals and said other output signals, and,
means responsive to said other output signals connected to said last mentioned means for converting and simultaneously storing.

21. A programmable logic array system according to claim 13 wherein said means responsive to said output signals further includes
means connected to said means for providing for converting said noninverted output signals to other output signals and for simultaneously storing said noninverted output signals and said other output signals, and,
means responsive to said other output signals connected to said last mentioned means for converting said simultaneously storing.

22. A programmable logic array system according to claim 14 wherein said means responsive to said output signals further includes
means for connected to said means for providing for converting said inverted output signals to other input signals and for simultaneously storing said inverted output signals and said other output signals, and,
means responsive to said other output signals connected to said last mentioned means for converting and simultaneously storing.

23. A programmable logic array system according to claim 20 wherein said means for converting said noninverted output signals to other output signals includes
a memory array which includes a plurality of personalized Josephson junction memory cells the output of which is a stored logic function of said noninverted output signals.

24. A programmable logic array system according to claim 16 wherein said means for converting said inverted output signals to other output signals includes
a memory array which includes a plurality of personalized Josephson junction memory cells the output of which is a stored logic function of said inverted output signals.

25. A programmable logic array system according to claim 17 wherein said Josephson junction memory cells are arranged in a plurality of storage loops each of said loops including a smaller plurality of said memory cells arranged in series, and,
means connected to each of said loops for applying gate current to each of said memory cells.

26. A programmable logic array system according to claim 18 wherein said means responsive to said output signals includes
means for providing output signals connected to said means for converting said input signals and simultaneously storing said output signals.

27. A programmable logic array system according to claim 19 wherein said means for providing includes a plurality of Josephson junction circuits each of which switches in response to the presence of an output signal delivering a replica of said output signals to said means for converting said output signals to other signals and, wherein said means responsive to said other output signals includes means for inverting said other signals.

28. A programmable logic array system according to claim 21 wherein said means for converting and storing said other output signals includes
a memory array which includes a plurality of personalized Josephson junction memory cells the output of which is a stored logic function of said noninverted output signals.

29. A programmable logic array system according to claim 22 wherein said means for converting and storing said other output signals includes
a memory array which includes a plurality of personalized Josephson junction memory cells the output of which is a stored logic function of said inverted output signals.

30. A programmable logic array system according to claim 25 wherein said means for applying gate current includes a source of direct current, a Josephson junction shunting each of said loops, each of said junctions being disposed in series with said source of direct current, and means for simultaneously switching each of said junction to place each of said loops in series with said source of direct current.

31. A programmable logic array system according to claim 25 wherein said means for applying gate current includes a source of alternating current, a Josephson junction shunting each of said loops, each of said junctions being disposed in series with said source of alternating current, and means for simultaneously switching each of said junctions to place each of said loops in series with said source of alternating current.

32. A programmable logic array system according to claim 30 further including a plurality of control lines each one connected to a respective one of said pulsed current sources and disposed in electromagnetically coupled relationship with a plurality of said Josephson junction memory cells each one of said plurality of Josephson junction memory cells being disposed in a different loop.

33. A programmable logic array system according to claim 31 further including a plurality of control line each one connected to a respective one of said pulsed current sources and disposed in electromagnetically coupled relationship with a plurality of said Josephson junction memory cells each one of said plurality of Josephson junction memory cells being disposed in a different loop.

* * * * *